United States Patent [19]

Tazaki

[11] Patent Number: 4,685,048
[45] Date of Patent: Aug. 4, 1987

[54] AC-DC TRANSFORMATION CIRCUIT

[75] Inventor: Satoru Tazaki, Tokyo, Japan

[73] Assignee: Clarion Co., Ltd., Tokyo, Japan

[21] Appl. No.: 838,999

[22] Filed: Mar. 12, 1986

[30] Foreign Application Priority Data

Mar. 29, 1985 [JP] Japan ................................. 60-65573

[51] Int. Cl.$^4$ ........................................ H02M 7/217
[52] U.S. Cl. .................................. 363/127; 307/261; 328/26
[58] Field of Search ....................... 363/73, 125, 127; 323/312, 315, 316; 328/26; 329/166; 307/261; 330/257

[56] References Cited

U.S. PATENT DOCUMENTS

| | | | |
|---|---|---|---|
| 4,053,796 | 10/1977 | van de Plassche | 363/127 X |
| 4,333,141 | 6/1982 | Nagano | 363/127 |
| 4,523,105 | 6/1985 | Jose et al. | 363/127 X |
| 4,575,643 | 3/1986 | Sakai | 363/127 X |

*Primary Examiner*—Peter S. Wong
*Attorney, Agent, or Firm*—Flynn, Thiel, Boutell & Tanis

[57] ABSTRACT

An AC-DC transformation circuit according to this invention facilitates operational stability by transforming an AC inputted voltage first into current and then transforming the current into a DC voltage.

9 Claims, 7 Drawing Figures

AC-DC TRANSFORMATION CIRCUIT

FIELD OF THE INVENTION

This invention relates to an AC-DC transformation circuit, which can be used as a multipath detection means in an FM tuner, etc.

BACKGROUND OF THE INVENTION

An AC-DC transformation circuit as indicated in FIG. 4 is used as a multipath detection means in an FM tuner.

In the figure, $T_i$ represents an input terminal; $T_o$ indicates an output terminal; $C_1 \sim C_4$ are condensers; $R_6 \sim R_{11}$ are resistances; $Q_0$ is a transistor; $D_1 \sim D_3$ are diodes; and $+V_{cc}$ and $+V$ represent power supplies.

AMP indicates an amplifier circuit, which is constructed by a transistor $Q_0$ and resistances $R_6 \sim R_8$, and on the other hand REC is a voltage doubler rectifier circuit, which consists of diodes $D_1$, $D_2$ and condensers $C_2$, $C_3$.

In the construction described above AC input signals (voltage) $V_i$ consisting of multipath signals etc. applied to the terminal $T_i$ are fed through a coupling condenser $C_1$ to the amplifier circuit AMP, where they are amplified, and this amplified output is applied to the voltage doubler rectifier circuit REC. The voltage doubler type rectifier circuit is used in order to obtain a rectified output as large as possible and to increase the sensitivity to detect multipath signals. During positive half cycles the condenser $C_2$ is charged through the diode $D_1$ with the polarity indicated in the figure. In the same way, during negative half cycles the condenser $C_3$ is charged through the diode $D_2$ with the polarity indicated in the figure. In this way a rectified output, which is about twice as high as the amplified output, can be obtained between the two terminals of the condenser $C_3$ with the polarity indicated in the figure.

Further a condenser $C_4$ is charged by the power supply $+V$ and when the diode $D_3$ is cut off, the potential at its hot side (side opposite to ground) terminal is kept at $+V$. A diode $D_3$ is used for level shift.

When the AC input signals $V_i$ applied to the above mentioned input terminal $T_i$ increase under the off state of the diode $D_3$; the terminal potential of the condenser $C_3$ in the voltage doubler rectifier circuit REC rises accordingly; when this value (negative voltage) exceeds the forward voltage $V_D$ of the diode $D_3$, the diode $D_3$ is turned on at this moment and at the same time electric charge in the condenser $C_4$ is discharged through the diode $D_3$.

As the result, the voltage $+V$ is transformed into a DC voltage $V_0$ depending on the level of the AC input signals $V_i$ applied to the terminal $T_i$, which is outputted at the terminal $T_0$.

When no AC input signals $V_i$ are applied, or when they are applied, but their rectified output is lower than the above mentioned forward voltage $V_D$, since the diode $D_3$ keeps its cut off state, the terminal voltage $+V$ of the condenser $C_4$ is outputted at the terminal $T_0$ as a DC voltage, as it is.

In this way, when multipath signals are produced, the voltage of the power supply $+V$ is transformed into a DC voltage $V_0$ to be outputted, dependent on the level of the AC signals $V_i$ so that its level can be detected.

The prior art AC-DC transformation circuit constructed as described above has the following problematical points.

(i) The detection sensitivity cannot be raised.

In order to raise the detection sensitivity, it is necessary to transform surely the AC input signal $V_i$ into a DC output, even if its level is low. For this purpose it is necessary that the rectified output level, i.e. the amplifier output level is high. Consequently the gain of the amplifier circuit must be increased. However, a multistage amplification is necessary therefor and thus it is feared that not only the number of parts is increased, but also operation of the circuit becomes unstable.

(ii) It is a mean value that is detected.

In order to effect air accurate multipath detection, it is necessary to detect peak values of the input signals. However, in the case where a low level signal is produced instantaneously (singly), although the aforementioned condenser $C_3$ is charged, its terminal potential cannot reach the value necessary to change the cut off state of the diode $D_3$. Only when these signals are produced frequently, the level of each of the signals is integrated and the diode $D_3$ can be turned on. The DC voltage detected in this case is an average value of a plurality of signals and doesn't correspond to each of the signals.

(iii) Response characteristics are not good.

Since a condenser is used therein, a certain charging time is necessary and its detection work is slow correspondingly. Although the response characteristics can be ameliorated by using a small capacity condenser, it decreases the effect to removing AC components and thus decreases the AC-DC transformation efficiency.

(iv) The operation starting point cannot be set arbitrarily.

Although a level shift of the operation starting point of the AC-DC transformation circuit by a voltage drop corresponding to the forward voltage $V_D$ of the diode $D_3$ is possible, no level shift smaller than $V_D$ is possible.

(v) The circuit is not suitable to be made in the form of an IC.

Since a voltage doubler rectifier circuit is used therein,, large capacity condensers $C_2$, $C_3$ are necessary, which is a bottleneck in making the circuit in the form of an IC.

OBJECT OF THE INVENTION

This invention has been done from the viewpoint described above and the object of this invention is to provide an AC-DC transformation circuit permitting to remove the problematical points described above by transforming once the AC input voltage into current by means of a voltage-current transformation circuit.

SUMMARY OF THE INVENTION

In order to achieve this object, an AC-DC transformation circuit according to this invention is characterized in that it comprises:

(A) a voltage-current transformation circuit transforming inputted AC voltage into current having an intensity corresponding to its level, (B) a current mirror circuit using the current obtained by the transformation described above as a reference current and changing it to a variable current having an intensity depending on the ratio of two emitter resistances, and (C) a current-voltage transformation circuit transforming the variable current mentioned above into a DC voltage depending on its intensity.

In the construction described above the AC input voltage is transformed first into a current, which is changed to a current having an arbitrary intensity depending on the ratio of two emitter resistances of a current mirror circuit. Since the AC input voltage is transformed into a DC voltage depending on this variable current, it is not necessary to increase the amplification factor and thus stabilization of the operation of the circuit can be achieved.

DETAILED DESCRIPTION

Figure 1:
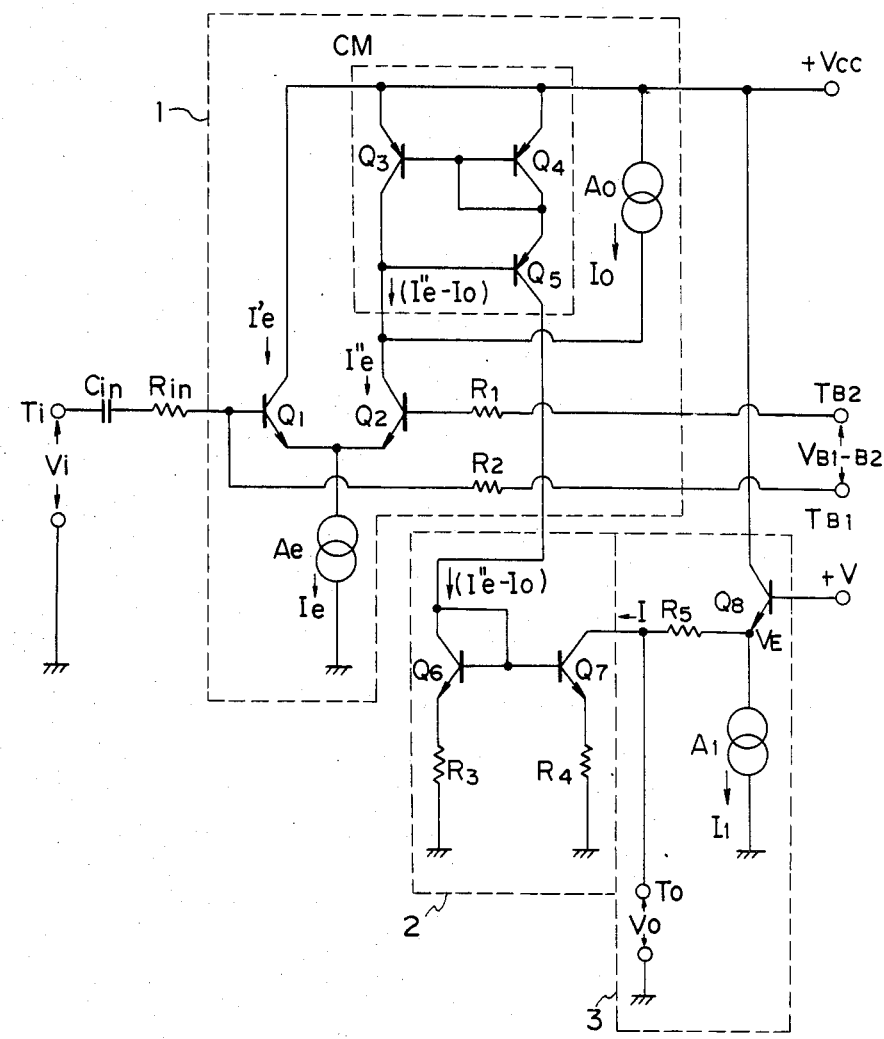
FIG. 1 is a circuit diagram showing an embodiment according to this invention.

Hereinbelow this invention will be explained, referring to the drawings.

FIG. 1 is a circuit diagram of the AC-DC transformation circuit according to an embodiment of this invention, in which $C_{in}$ represents a condenser; $R_{in}$, $R_1 \sim R_5$ are resistances; $Q_1 \sim Q_8$ are transistors; $A_e$, $A_o$ and $A_1$ are constant current sources; $T_{B1}$ and $T_{B2}$ indicate base input terminals.

Further the block 1 is a voltage-current mirror circuit; and the block 3 is a current-voltage transformation circuit. The above-mentioned voltage-current transformation circuit 1 comprises a differential amplifier consisting of transistors $Q_1$, $Q_2$ and a constant current source $A_e$ connected in common with their emitters, and a reference current source constructed by a current mirror circuit CM consisting of transistors $Q_3$, $Q_4$ and $Q_5$ connected with the in-phase output of the differential amplifier and a constant current source $A_o$. The above mentioned current-voltage transformation circuit 3 comprises an emitter follower type buffer consisting of a transistor $Q_8$ and a constant current source $A_1$ connected with the emitter of the transistor $Q_8$.

When the potential difference between the base input terminals $T_{B1}$ and $T_{B2}$ of the two transistors $Q_1$ and $Q_2$, respectively, is equal to 0, the collector currents, i.e. the output currents of the differential amplifier described above, are equal to each other and therefore each of them is ½ of the constant current $I_e$ from the constant current source $A_e$ (these are DC currents, in the case where no AC input signals are applied to the input terminal).

In the case where there is a potential difference between the above mentioned base input terminals $T_{B1}$ and $T_{B2}$, the output current of each of the transistors $Q_1$ and $Q_2$ varies depending on its base potential. However, even in this case, between the output currents $I_e'$ and $I_e''$ of the transistors $Q_1$ and $Q_2$, respectively, a relationship $I_e' + I_e'' = I_e$ is valid. Consequently they seasaw, i.e. when one of them increases, depending on the base potential, the other decreases always.

According to this invention the circuit is operated under the condition that there exists a constant potential difference $V_{B1-B2}$ between the base input terminals $T_{B1}$ and $T_{B2}$ so that the potential of the latter is lower than that of the former.

The working mode of the AC-DC transformation circuit according to this invention will be explained below.

Figure 2A:
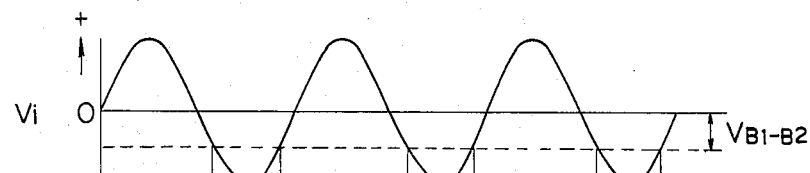
FIGS. 2 (a) to (d) are schemes indicating various waveforms for explaining of this invention.

Suppose that an AC input signal (voltage) $V_i$, as indicated in FIG. 2(a), is applied from the input terminal $T_i$ through $C_{in}$ acting as a coupling condenser and $R_{in}$ acting as a resistance for preventing electro-static destruction to the base input terminal $T_{B1}$ of the transistor $Q_1$ in the above described differential amplifer and that the potential at the base input terminal $T_{B2}$ of the transistor $Q_2$ is kept at a potential which is lower b $V_{B1-B2}$ than that of the former when no input signal is applied to the input terminal $T_i$.

Figure 2B:
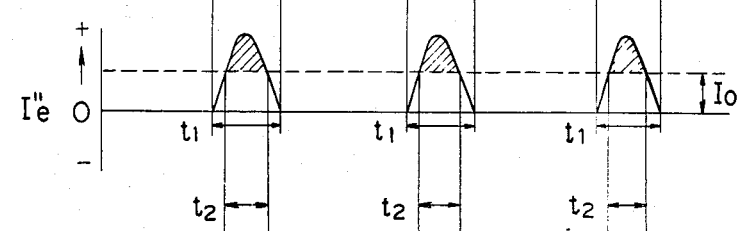

As the result an output current $I_e''$, as indicated in FIG. 2(b), flows through the transistor $Q_2$, which is at the in-phase output side of the differential amplifier. The period of time $t_1$, during which this output current $I_e''$ flows, is limited to a region where the potential during the negative half cycle of the AC input signal exceeds the aforementioned potential difference $V_{B1-B2}$.

Further, a part of the output current $I_e''$, which is equal to the constant current $I_o$, is supplied by the constant current source $A_o$ and when the output current $I_e''$ increases, exceeding this constant current $I_o$, the exceeding part $(I_e'' - I_o)$ is supplied by the current mirror circuit CM described above.

Figure 2C:
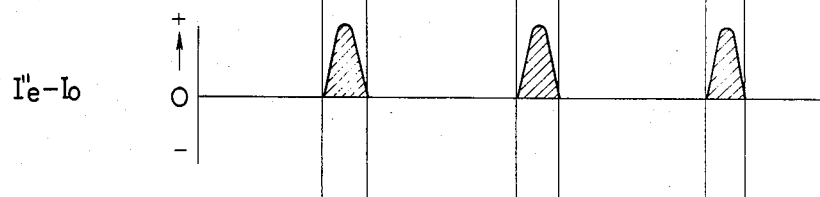

This exceeding part $(I_e'' - I_o)$ is a current, into which the AC input signal is transformed by the voltage-current transformation circuit 1 and, depending on its level, the so-called transformed current flows only during a period of time $t_2$ as indicated in FIG. 2(c).

This transformed current $(I_e'' - I_o)$ flows further as a mirror current in the collector of $Q_6$ in the transistors $Q_6$ and $Q_7$ constituting a current-mirror circuit 2 described above. In this case, the collector current I of the other transistor $Q_7$ is determined by the ratio of the resistances $R_3$ and $R_4$ connected with the emitter of the transistors $Q_6$ and $Q_7$, respectively, on the basis of the collector current $(I_e'' - I_o)$, as follows.

$$\frac{(I_e'' - I_o)}{I} = \frac{R_4}{R_3} \therefore I = \frac{R_3}{R_4}(I_e'' - I_o)$$

That is, the transformed current $(I_e'' - I_o)$ described above is changed to a variable current I by the current mirror circuit 2, depending on the ratio of the emitter resistances of the transistors $Q_6$ and $Q_7$ constituting circuit 2.

This variable current I flows also through a resistance $R_5$ connected with the emitter $Q_8$ in the current-voltage transformation circuit 3. By this fact a voltage drop $I \times R_5$ is produced over the resistance $R_5$. Further, since the power supply $+V$ is connected with the base of the transistor $Q_8$, the potential $V_E$ of this emitter is kept at $(+V - V_{BE})$.

In this state, if the current mirror circuit 2 doesn't operate, i.e. if no AC input signal is applied to the input terminal $T_i$, since the above mentioned variable current I is 0, the emitter potential $(+V - V_{BE})$ is outputted as a DC voltage $V_o$ at the output terminal $T_o$, as it is.

On the other hand, when an AC input signal is applied to the input terminal Ti, since the voltage-current transformation circuit 1 and the current mirror circuit 2 operate, a transformed current $(I_e'' - I_o)$ flows and thus a variable current flows, too. Consequently a DC voltage $V_o$ obtained by subtracting the voltage drop ($I \cdot R_5$) over the resistance $R_5$ from the emitter potential ($+V - V_{BE}$), as indicated below, is outputted at the output terminal $T_o$.

$$V_o = (+V - V_{BE}) - I \cdot R_5$$

Figure 2D:
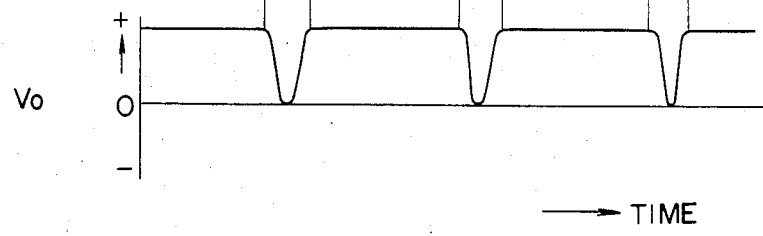

This output is a DC voltage, into which the variable current I determined by the ratio of the emitter resistances $R_3$ and $R_4$, on the basis of the transformed current ($I_e'' - I_o$) described above, is transformed by the current-voltage transformation circuit 3, depending on its intensity. Therefore the output decreases, following the variation of the peak value of the AC input signal indicated in (a) only during the period of time, which is in accordance with the period of time $t_2$, during which the transformed current ($I_e'' - I_o$) flows, as indicated in FIG. 2(d).

Next, the reason why the potential difference $V_{B1-B2}$ is given, as an operation condition according to this invention, between the base input terminals $T_{B1}$ and $T_{B2}$ of the transistors $Q_1$ and $Q_2$, respectively, in the differential amplifier, as indicated above, will be explained below.

Figure 3:
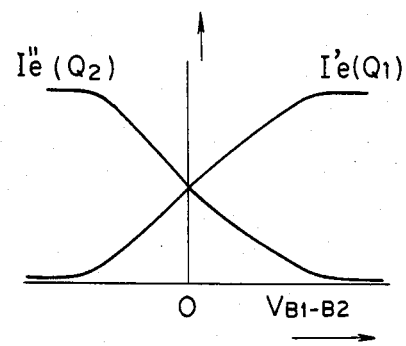
FIG. 3 is a diagram showing characteristics of a circuit according to this invention.
Figure 4:
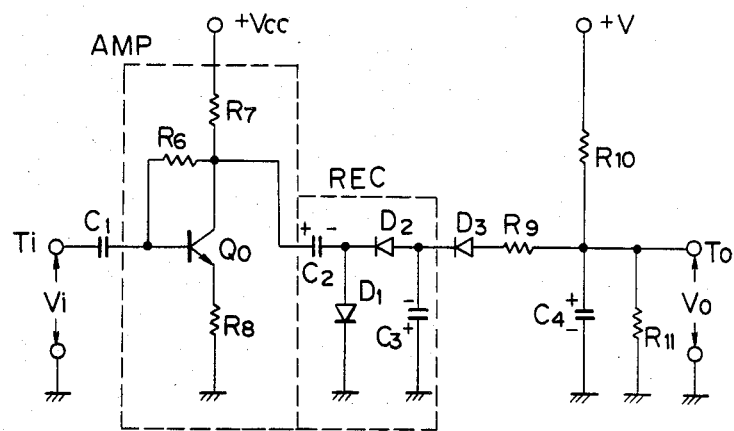
FIG. 4 is a circuit diagram showing an example of the prior art techniques.

In the case where the base potential difference is 0, the output currents $I_e'$ are equal and $I_e''$, as indicated in FIG. 3. On the other hand, when there exists a base potential difference, they seesaw, i.e. one of the output currents decreases or increases contrarily to the other, while holding the relationship $I_e' + I_e'' = I_e$.

When multipath signals are observed from this viewpoint, multipath signals have a tendency that ripple components are greater at the negative side.

Taking this tendency into consideration, if there existed no base potential difference, the dynamic range would be too narrow. In order to remove this drawback, it is preferable to set the base potential of the transistor $Q_2$, which is at the in-phase output side, at a lower value (at the negative side) than that of the transistor $Q_1$. In this case, the potential difference $V_{B1-B2}$ to be set determines the conduction angle $\theta$ corresponding to the period of time $t_1$, during which the output current $I_e''$ of the transistor $Q_2$ flows.

As it is obvious from the above description, since the AC-DC transformation circuit according to this invention is so constructed that an AC input vottage is transformed first into a current and after having then been transformed into a variable current having an arbitrary intensity, depending on the ratio of the emitter resistances in a current mirror circuit, the current is transformed into a DC voltage depending on this variable current, the following effects can be obtained.

(i) The detection sensitivity can be raised.

Since the AC signal is transformed into a DC voltage by transforming it first into a current, it is not necessary to increase the gain of the amplifier circuit, and further it is possible to enlarge the dynamic range of the differential amplifier and to increase in this way the detection sensitivity. Therefore it is possible to stabilize operation of the circuit.

(ii) The peak value of multipath signals can be detected.

Since the DC voltage is outputted by using the transformed current from the reference current source, the peak value of a multipath signal produced singly can be detected accurately.

(iii) Response characteristics are good.

Since no condenser is used in the process of the transformation into the DC output voltage, there is no delay in the detection operation due to charging.

(iv) The operation starting point can be arbitrarily set.

Since no level shift operation by means of a diode is used, the operation starting point can be set arbitrarily. That is, since, when the value of the constant current $I_o$ in FIG. 1 is set arbitrarily, the part of the constant current exceeding ($I_e'' - I_o$) is the temperature current, when the value of the constant current $I_o$ is large, the operation starting point is high, and when the value is small, it is low.

(v) The circuit is suitable to be made in the form of an IC.

Since only a small capacity coupling condenser is used for the AC input signal and no large capacity condensers for the rectification are necessary, it is easy to make the circuit in the form of an IC. Further, since the coupling condenser can be used as an external part, it becomes still easier, in this case, to make the circuit in the form of an IC.

Although this invention has been explained, while taking the case of the detection means of multipath signals, this invention is not limited thereto, but it can be applied, in general, widely for the detection means of an AC signal component produced singly.

The embodiments of the invention in which an exclusive property or privilege is claimed are defined as follows:

1. An FM tuner comprising transformation circuit means for facilitating multipath detection, said transformation circuit means including:

voltage-current transformation means for transforming an AC input voltage which includes multipath noise into a transformed current having a magnitude which corresponds to the amplitude of said input voltage;

first current mirror circuit means for transforming said transformed current into an output current, said first current mirror circuit means including first and second transistors and including first and second emitter resistances which are each coupled to the emitter of a respective one of said first and second transistors, said output current having a magnitude dependent on a ratio of said first emitter resistance to said second emitter resistance; and current-voltage transformation means for transforming said output current into an output voltage having a magnitude dependent on the magnitude of said output current;

wherein said voltage-current transformation means includes: third and fourth transistors coupled to form a differential amplifier, the input AC voltage being applied to a base of said third transistor; means for maintaining a constant potential difference between the bases of said third and fourth transistors so that the potential at a base of said fourth transistor is lower than that at the base of said third transistor; second current mirror circuit means connected to a collector of said fourth transistor of said differential amplifier; and a constant current source coupled to said fourth transistor; and wherein said current-voltage transformation means includes an emitter follower circuit coupled to said first current mirror circuit means.

2. An FM tuner apparatus comprising transformation circuit means for facilitating multipath detection, said transformation circuit means including:

voltage to current transformation means for transforming an AC input voltage which includes multipath noise into a transformed current having a magnitude which corresponds to the amplitude of said input voltage, said voltage to current transformation means including a differential amplifier having first and second inputs and an output, means connected to said first and second inputs of said differential amplifier for maintaining a constant difference in potential therebetween, and a current mirror circuit having an input connected to said output of said differential amplifier and having an output which carries said transformed current;

current mirror menas for transforming said transformed current into an output current having a magnitude proportional to the magnitude of said transformed current; and current to voltage transformation means for transforming said output current into an output voltage having a magnitude which varies in dependence on variations in the magnitude of said output current.

3. The apparatus of claim 2, wherein said current mirror means includes a first transistor having a collector and a base which are each connected to said output of said current mirror circuit, a first resistor which has a first end connected to an emitter of said first transistor and a second end connected to ground, a second transistor having a base connected to said base of said first transistor, and a second resistor which has a first end connected to an emitter of said second transistor and a second end connected to ground, said output current being a current flowing into a collector of said second transistor; and wherein a ratio of a magnitude of said output current relative to a magnitude of said transformed current is equal to a ratio of the resistance of said first resistor to the resistance of said second resistor.

4. The apparatus of claim 3, wherein said current to voltage transformation means includes a third transistor having a collector and a base to which respective predetermined reference voltages are applied, constant current source means connected between ground and an emitter of said third transistor, and a third resistor which has a first end connected to said emitter of said third transistor and a second end connected to said collector of said second transistor, said output voltage being the potential between said collector of said second transistor and ground.

5. The apparatus of claim 4, wherein said means for maintaining a constant difference inpotential between said inputs of said differential amplifier includes two bias voltage terminals, and two resistors which each have a first end connected to a respective said bias voltage terminal and which each have a second end connected to a respective said input of said differential amplifier.

6. The apparatus of claim 5, wherein said differential amplifier includes fourth and fifth transistors having emitters which are connected to each other and having bases which are respectively said inputs of said differential amplifer, and includes constant current source means connected between ground and said emitter of said fourth transistor, said fourth transistor having a collector to which is applied a predetermined reference voltage, wherein said fifth transistor has a collector which is connected to said input of said current mirror circuit.

7. The apparatus of claim 6, wherein said current mirror circuit includes sixth, seventh and eighth transistors, wherein said seventh transistor has an emitter to which is applied a predetermined reference voltage, wherein said sixth transistor has an emitter to which is applied a predetermined reference voltage, has a base which is connected to a base and a collector of said seventh transistor and to an emitter of said eighth transistor, and has a collector which is connected to a base of said eighth transistor and to said collector of said fifth transistor, and wherein said eighth transistor has a collector which is connected to said collector of said first transistor, said transformed current being the collector current of said eighth transistor.

8. The apparatus of claim 7, wherein said voltage to current transformation means includes constant current source means connected between a predetermined reference voltage and said collector of said fifth transistor.

9. The apparatus of claim 8, wherein said means for applying said input voltage to said differential amplifier includes an input terminal, a condensor having a first end connected to said input terminal and having a second end, and a resistor having a first end connected to said second end of said condensor and a second end connected to said base of said fourth transistor.

* * * * *